United States Patent [19]

Calhoun

[11] 3,795,973

[45] Mar. 12, 1974

[54] MULTI-LEVEL LARGE SCALE INTEGRATED CIRCUIT ARRAY HAVING STANDARD TEST POINTS

[75] Inventor: Donald F. Calhoun, Inglewood, Calif.

[73] Assignee: Hughes Aircraft Company, Culver City, Calif.

[22] Filed: Dec. 15, 1971

[21] Appl. No.: 208,419

Related U.S. Application Data

[63] Continuation of Ser. No. 16,867, March 5, 1970, abandoned.

[52] U.S. Cl. .................... 29/574, 317/101 A

[51] Int. Cl. .................... H01l 19/00

[58] Field of Search .................... 317/101 A; 29/574

[56] References Cited

UNITED STATES PATENTS

| | | | |
|---|---|---|---|
| 3,423,822 | 1/1969 | Davidson et al. | 317/101 A |
| 3,303,400 | 2/1967 | Allison | 317/101 A |
| 3,553,830 | 1/1971 | Jenny et al. | 29/574 |
| 2,982,002 | 5/1961 | Shockley | 317/101 A |

FOREIGN PATENTS OR APPLICATIONS

| | | | |
|---|---|---|---|
| 1,117,579 | 6/1968 | Great Britain | 317/101 A |

*Primary Examiner*—David Smith, Jr.
*Attorney, Agent, or Firm*—W. H. MacAllister, Jr.

[57] ABSTRACT

A complex multi-level integrated circuit array comprising a wafer having a plurality of cells in a rectilinear array and alternating layers of dielectric insulation, and metalization formed in a laminae on top of the wafer. Vias in a first layer of insulation expose the pads of selected usable cells in a first layer of metalization to a second layer of metalization which is formed into individual conductors for effectively relocating the exposed pads of selected usable cells to master pattern cell locations where no usable cells are located, and further including "feed under" conductor segments formed over specified nonused cell locations. A second layer of insulation has vias at standard master pattern locations which expose the master pattern pads to a standard or master pattern of interconnect lines formed in a top layer of metalization which interconnect the cells into a functional circuit type. The standard pattern of interconnect lines has a plurality of test pads formed therein at standard locations for utilizing the same test pads and locations on all integrated circuits having the same part type and associated with the top layer standard mask.

5 Claims, 7 Drawing Figures

INVENTOR.
DONALD F. CALHOUN,
BY
Robert Thompson
ATTORNEY.

MULTI-LEVEL LARGE SCALE INTEGRATED CIRCUIT ARRAY HAVING STANDARD TEST POINTS

This is a continuation of application Ser. No. 16,867 filed Mar. 5, 1970 now abandoned.

BACKGROUND OF THE INVENTION

This invention relates generally to integrated circuits and relates more particularly to the provision of standard test points in the top layer of metalization of multi-level complex integrated circuits including large scale integrated circuits.

In integrated circuit technology wafers having a non-uniform yield of good cells have heretofore been interconnected by producing a plurality of masks tailored for that particular wafer yield distribution of usable cells, each mask being associated with an individual alternating layer of dielectric insulation on metalization. A first one of these masks was utilized during fabrication to define and form feedthroughs or vias in a first layer of insulation exposing the first level metalization pads of selected good cells on the wafer to the second layer of metalization. A second mask was utilized to form a second layer of metalization into interconnect lines associated with the vias in the first layer of insulation and vias which were subsequently formed in a second layer of insulation by a third mask. At least one and possibly more layers of metalization were formed on top of the second layer of insulation and fabricated into interconnect lines and crossovers as defined by at least a fourth mask whereupon all of the selected good cells were electrically interconnected into a functionally specified complex integrated circuit.

Since all of the above masks were tailored to the yield distribution of each individual wafer, the location of signal lines associated with specific test signals, or specific cells and circuits were uniquely positioned on a wafer-to-wafer basis. This resulted because the conductors varied in position and routing on each top layer of metalization since the masks in turn varied from integrated circuit wafer to integrated circuit wafer. In addition, since some of the circuits interconnect lines and signal lines were not brought to the top layer of metalization, the signals associated with them could not be tested by test probe techniques.

SUMMARY OF THE INVENTION

Objects, features and advantages of this invention can be attained with the provision of an integrated circuit wafer having a yield distribution of good circuits, and alternate layers of dielectrical insulation and metalization formed on top of the wafer. As described in my copending U.S. patent application Ser. No. 762,459 entitled Integrated Circuit Interconnections, filed Sept. 25, 1968, the first layer of insulation has vias fabricated therethrough and tailored to the particular wafer yield for exposing pads of selected usable cells to the second layer of metalization. This second layer of metalization is in turn formed into interconnect lines tailored to the wafer yield distribution for effectively relocating, by electrical conductor routing, the exposed pads of selected cells to master pattern circuit locations where no usable cell was located or in registry therewith. Thereafter a second layer of insulation having vias at master pattern locations exposing the master pattern circuit locations, as defined by a standard mask, is formed on top of the second layer of metalization. Then a third layer of metalization is formed on top of the second layer of insulation and formed into a fixed or master pattern routing of interconnect lines as defined by a standard mask to functionally interconnect the master pattern of usable cells into a specified circuit part type. The top layer of metalization is featured by a plurality of signal test pads formed therein at specified standard locations.

These standard test pads can be utilized for all wafers of the same part type and have the advantages that: all desired usable signal points in complex integrated circuits are brought to the top layer of metalization; test points exist in standard locations which can be used to monitor outputs or to simulate inputs for facilitating checkout without requiring additional package leads; standard test pads can be defined in the top layer of metalization which can be utilized to control — by presetting or preclearing — the flip-flop logic states in sequentially operated logic arrays thereby usually enabling the test schedule to be reduced to a set of combinational tests; standard test pads can be associated with redundant circuit elements in such a way that they enable the individual circuit elements to be tested to determine if one of the redundant circuits is faulty thereby specifically identifying the faulty circuit and enabling a repair to be made; and since any of the above mentioned test and control points can be established at fixed positions in the top layer of metalization, automated probe testing of the arrays can be utilized to improve the economy, efficiency and reliability over prior manual nonstandard probe checkout methods.

BRIEF DESCRIPTION OF THE DRAWINGS

Other objectives, features and advantages of this invention will become apparent upon reading the following detailed description and referring to the accompanying drawings wherein.

DESCRIPTION OF A PREFERRED EMBODIMENT

Figure 1:
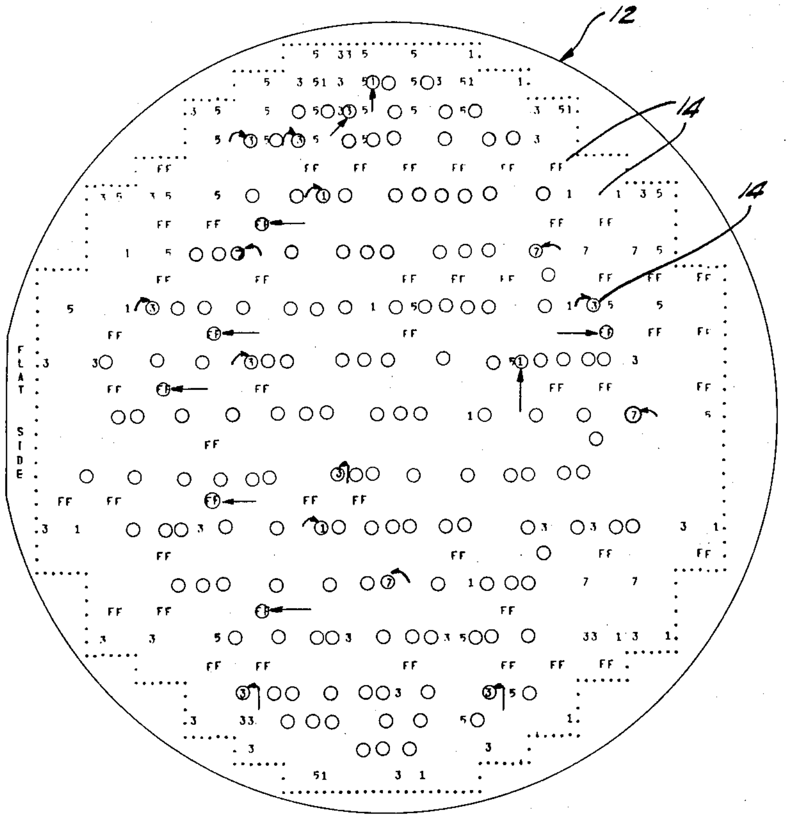
FIG. 1 is a schematic graphical illustration of the yield distribution of usable cells relative to a master pattern of cell locations wherein selected usable cells are relocated to master pattern cell locations as illustrated schematically by the line having an arrowhead.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells 14 which are generally rectangular and, in the embodiment illustrated, arranged in a rectilinear array. Each one of these cells can, for example, be 0.060 inch by 0.060 inch and is electrically separated from the adjacent cells by a border of electrically isolating material. The cell itself can include a plurality of active circuit elements such as semiconductor diodes and transistors and passive elements such as conductors, resistors, and capacitors. These elements are coupled together by metalization in the wafer 12 into a predetermined circuit configuration so that when electrical signals are applied to signal connects of the cells, it will operate in a predetermined manner.

In order to facilitate signal connections with the individual cells 14 each cell includes a plurality of signal connect members or pads 16 located at termination ends of signal lines. These pads 16 usually have a somewhat larger dimension and area than the signal line widths which they are associated with. For example, the pads 16 can have a dimension of 0.003 inch × 0.003 inch whereas the associated conductor may only be 0.001 inch wide. There can, for example, be fourteen or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter when the term cell is used it should be understood that this is intended to cover both the entire cell of any functional portion thereof. Furthermore, in those instances where the term "usable cells" is used it is intended to be synonymous with the term "good cells" or any portion thereof.

The yield of usable cells to total cells on the wafer 12 has heretofore been less than 100 percent. For example, the yield typically can be between 20 percent and 80 percent and possibly more. With such yield there is no discernible pattern to the specific locations of usable cells 14 and unusable cells 14 since they are located unpredictably across the array even though there is a tendency for good cells 14 to be predominantly located toward the center of the wafer 12.

In order to determine which of the cells 14 is usable or good, they are generally tested electrically so that the good cells can be determined and properly identified. Generally a DC electrical test is made of each circuit to obtain adequate identification of the good circuit. In addition, further AC electrical testing of the good cells can be performed for added confidence in the operational capabilities of the circuit.

After electrical testing of the cells 14 has been completed it is usually determined that the unusable cells occur in an unpredictable pattern as exemplified by the symbols 1, 3, 5, 7 and FF located within the rectangular integrated circuit cells 14 of FIG. 1. In this particular example: the symbol 1 is representative of a defective one input NAND gate; the symbol 3 is representative of a defective three input NAND gate; the symbol 5 is representative of a defective five input NAND gate; the symbol 7 is representative of a defective seven input NAND gate; and the symbol FF is representative of a defective flip-flop. Those cells that do not have one of the above identified symbols located therein are representative of a good or usable integrated circuit cell 14.

A master pattern of cell locations selected for a five bit sign and magnitude modular multiplier fabricated from a Texas Instrument integrated circuit slice part number K1206 is represented in FIG. 1 by means of a plurality of geometric symbols such as a circle "O".

Where actual good cells 14 exist in general registry with or coincidence with a master pattern circuit location they are identified by one of the above identified geometric symbols within one of the otherwise blank rectangular cells 14. When, however, a master pattern cell location does not contain or coexist with a good cell, as represented by one of the geometric symbols and one of the symbols 1, 3, 5, 7 or FF within the same cell, it is necessary to relocate the pads 16 of a selected nearby usable cell 14 to pad locations at a master pattern circuit or cell location in a manner to be described in more detail subsequently with reference to FIG. 4.

Generally, nearby good cells 14 can be relocated to a master pattern cell location in a second layer of metalization by interconnect lines or electrical conductors 20 each routed from an exposed pad 16 of the selected good cell to a corresponding pad location at the master pattern circuit location but isolated from the latter circuit by a dielectric film. Such routing of the pad relocation lines 20 is illustrated schematically in FIG. 1 by the straight line segments having arrowheads at one end and extending between a selected good cell location and a master pattern cell location. It should, of course, be understood that each one of the lines 20 with arrowheads is representative of a plurality of individual interconnect lines or conductors, each of which is routed from a pad of a good cell to a pad at the master pattern cell location as illustrated in more detail in FIG. 3. It should be understood that a master pattern cell or circuit location does not have to be congruent with or superposed on a wafer cell location.

As a result of the relocation of selected good cells 14 to the master pattern cell location where no good cell would otherwise be found, a common or master pattern of good cells is effectively established. This allows standard or master pattern masks of vias and interconnect lines to be used to form an additional top layer of master pattern interconnect lines for interconnecting the individual cells 14 together into a specific part type, as will be described in more detail with reference to FIG. 5.

Figure 2A:
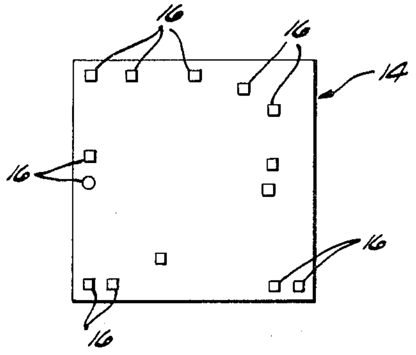
FIG. 2*a* is an enlarged top plan view schematically illustrating exemplary pad locations in the first layer of metalization of an integrated circuit cell.
Figure 2B:
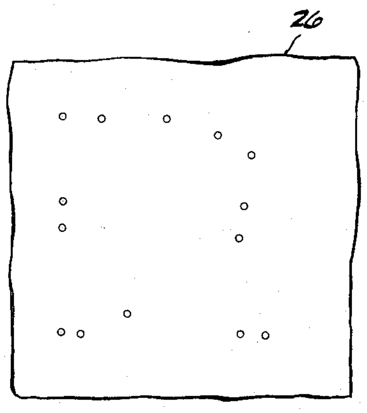
FIG. 2*b* is an enlarged schematic illustration of a portion of a mask of the type associated with the vias in a layer of insulation to expose the pads of an integrated circuit cell.
Figure 3A:
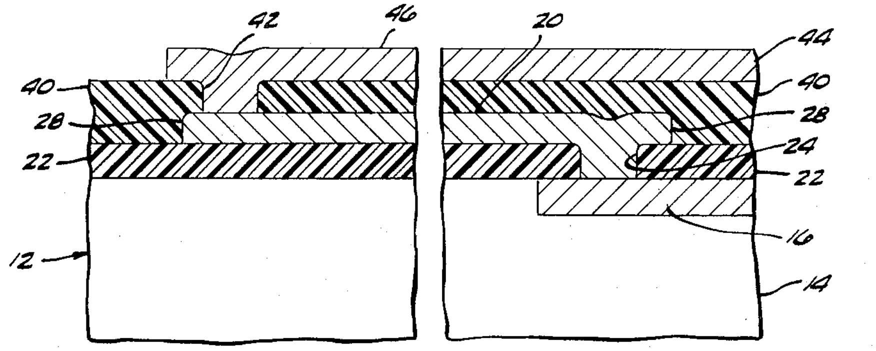
FIG. 3*a* is an enlarged cross-sectional side elevational view, not to scale, illustrating the relationship between the integrated circuit cell, vias in a first layer of dielectric insulation, pad relocation lines in a second layer of metalization, a master pattern vias in a second layer insulation, and master pattern interconnect lines in a third layer of metalization.

Reference is now made to one such fabrication of a complex integrated circuit, specific processing details of which are described in my copending patent application Ser. No. 762,459, entitled Integrated Circuit Interconnections, and filed on Sept. 25, 1968. As illustrated in FIG. 3*a*, the first layer of metalization integral with the surface of the wafer 12 and containing the pads 16 (FIG. 2*a*) has a layer of dielectric insulation material 22 such as low sodium glass or quartz formed thereon with vias 24 or feedthroughs processed therethrough in registration with the pads 16 of selected cell 14. These vias 24 are formed in the insulation 22 by a photoprocess such as by utilizing a via mask 26 produced for that particular wafer, a portion of which is shown in FIG. 2b. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2b since the scale on patent drawings is too small to adequately illustrate a vias aperture having an actual dimension of 0.001 inch. However, the specific location of vias 24 in the first layer of electrical insulation 22 can be identified and determined by referring to FIGS. 4 and 5 wherein the vias 24 are located at the termination ends of individual conductors in the second layer of metalization that are not coincident with another terminating end of conductors in the other layer of metalization or coincident with a feedunder in the second layer of metalization when the two metalization layers of interconnects are superposed over one another.

Figure 4:
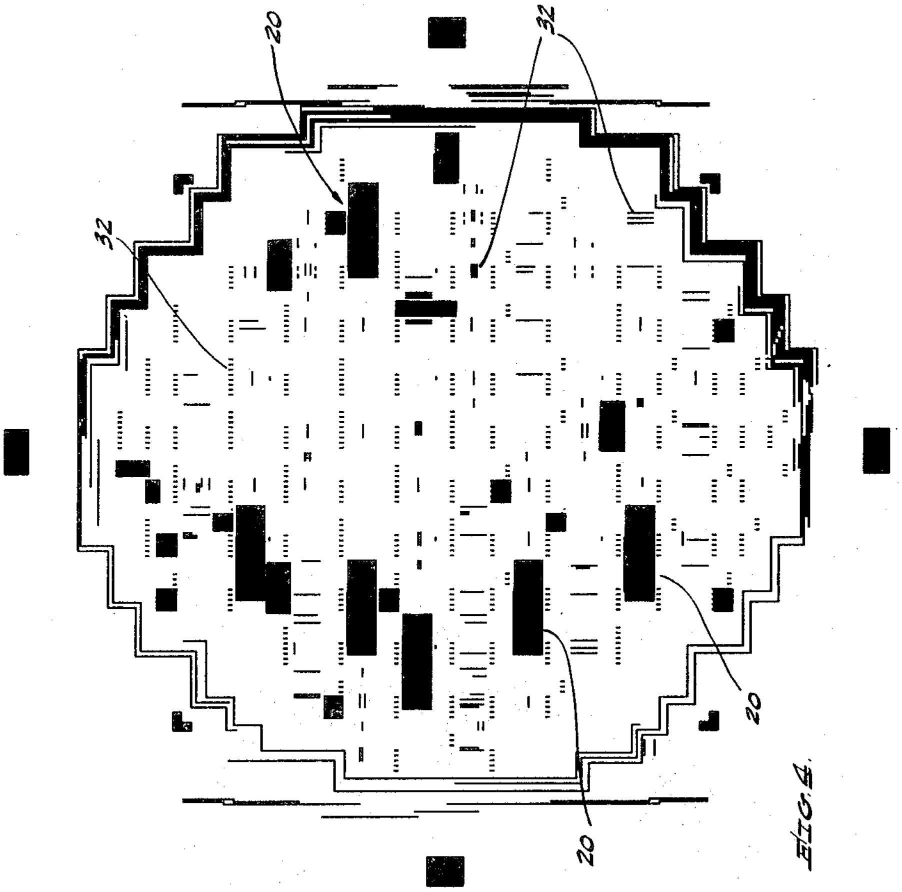
FIG. 4 is a top plan view of the second layer of metalization illustrating pad relocation lines and cross-under conductor line segments formed therein.

For purposes of illustration, the enlarged cross-sectional view, not to scale, in FIG. 3*a* schematically illustrates a via 24 extending from a pad 16 in the first layer of metalization on the face of an integrated circuit cell 14 to the second layer of metalization 28 such as, for example, aluminum which contains the pad relocation lines 20 illustrated generally in FIG. 4. As previously mentioned with reference to FIG. 1, these pad relocation lines 20 are each routed from pads 16 of selected usable cells to a master pattern circuit location. These master pattern circuit or cell locations include not only areas congruent to and superposed over wafer cells 14 but also includes areas above the wafer not in registry with or superposed over any one cell or bounded by any cell. For example, such master pattern locations can be the relocated signal connect ends or pads of the pad relocation conductors 20. Although these pad relocation lines are typically straight line segments 0.003 inch wide on 0.004 inch centers extending parallel to rectilinear coordinates, it would be possible to use other configurations and routing. The signal connect portions of the pad relocation conductors 20 are generally dimensioned at least as wide as a pad or can be formed into enlarged area pads (FIG. 4) or made narrower.

Figure 3B:
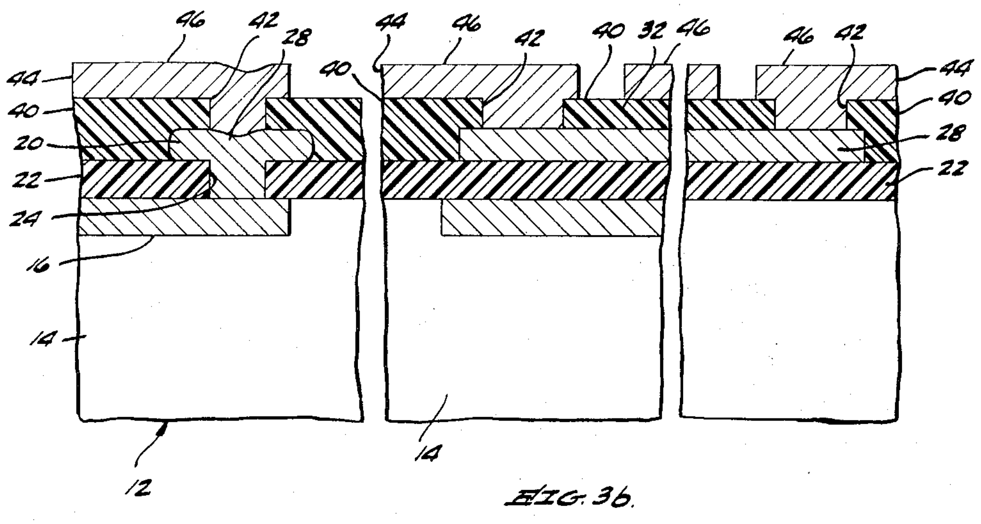
FIG. 3*b* is an enlarged cross-sectional side elevational view, not to scale, illustrating the relationship of the layers of dielectric insulation and vias between the pads of a usable integrated circuit cell and the master pattern interconnect line in a third layer of metalization, and in addition illustrates the relationship between master pattern vias in the second layer of insulation and cross-unders in the second layer of metalization.

Furthermore, as illustrated in FIG. 3*b* where a good cell 14 coexists at a master pattern circuit location, the via 24 formed through the first layer of electrical insulation 22 merely exposes the pad 16 of that good cell without necessarily requiring further routing of pad relocation lines 20 such as illustrated in FIG. 3*a*.

In addition to the pad relocation lines 20, the second layer of metalization 28 includes a plurality of crossunder conductor segments 32 located at reserved locations on the face of the first layer of insulation 22. As will be explained in more detail subsequently, some of these crossunders 32 can cooperate with the standard pattern of interconnect lines in the third layer of metalization illustrated in FIG. 5. As a result, all usable signal connect or logic lines must be brought to a top layer of metalization.

It should also be understood that these individual crossunder conductors 32 and pad relocation lines 20 are also formed in the second layer of metalization 28 by a photo process utilizing photoresist material and etching techniques, as described in more detail in my above referenced copending patent application. One technique is to expose the photoresist with a mask having conductors of the type illustrated in FIG. 4 tailored to the yield distribution of each wafer wherein the master pattern circuit locations are common to a plurality of wafers.

A second layer of dielectric insulation 40, such as for example, low sodium glass or quartz, is formed on top of the second layer of metalization 28 with fixed position or master pattern vias 42 formed at master pattern circuit locations by a master pattern mask common to plurality of wafer which have usable cells at master pattern circuit locations and which are to be fabricated into a specific part type. A portion of these vias 42 expose the terminating ends, signal connect portions, or pads, of pad relocations lines 20 in the second layer of metalization 28 as illustrated in FIG. 3a. In addition, some of the vias 42 are superposed over the vias 24 in the first layer of electrical insulation 22 as illustrated in FIG. 3b so that the pads 16 of the good cell in registry with the master pattern cell location are exposed to the top layer or third layer of metalization 44. In addition, some vias 42 are formed between terminating ends of standard pattern conductors 46 and the selected crossunder conductor segments 32. It should be noted that the crossunders 32 are not otherwise connected with the pads in the first layer of metalization or with pad relocation lines 20 in the second layer of metalization. Thus as previously stated, all signal lines are brought up to the top layer of metalization 44.

Figure 5:
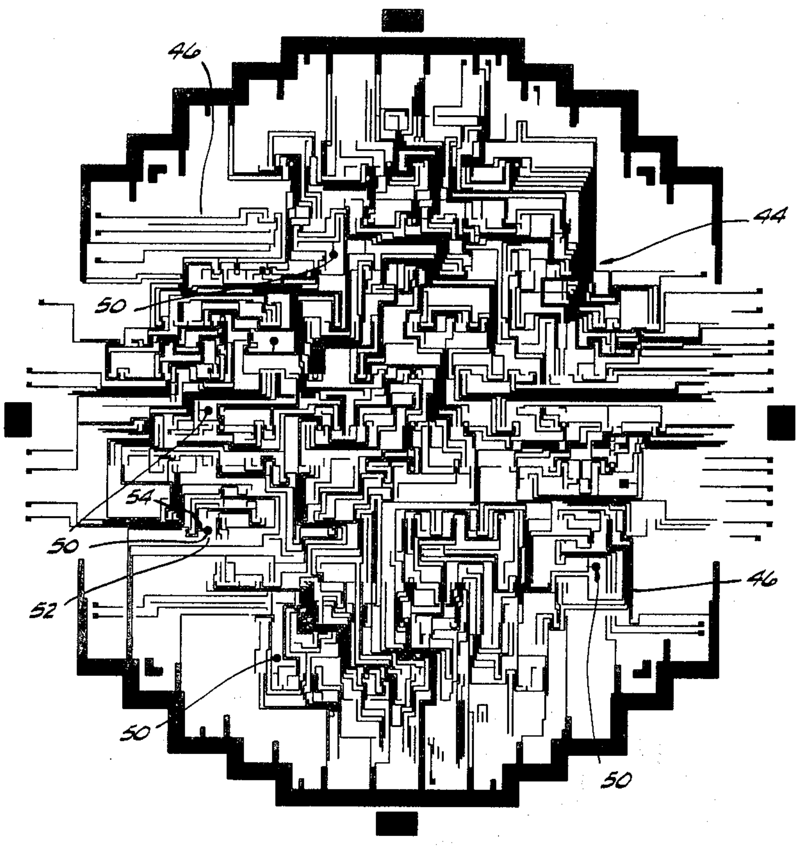
FIG. 5 is a top plan view of the third layer of the metalization illustrating the master pattern of test pads and interconnect lines which are selectively connected to the exposed pads of usable integrated circuit cell at master circuit locations, and to cross-unders in the second layer of the metalization through the master pattern vias.

Thereafter the top layer or third layer of metalization 44 such as, for example, aluminum, is formed on top of the second layer of dielectrical insulation 40 with the terminating ends or portions of the fixed or master pattern of interconnect lines 46 illustrated in FIG. 5 in registry with the vias 42 in the second layer of insulation 40. As a result, the individual master pattern of cells, as relocated, are interconnected into a specified functional circuit which, when electrical signals are applied to the signal input thereof, will operate in a predetermined manner to produce output signals of predetermined characteristics at its output terminals. It should be understood that the standard pattern conductors or interconnect 46 in the top layer of metalization 44 are also formed with a master pattern mask common to a plurality of wafers having usable cells of master pattern cell locations and which are to be interconnected into a specific function part type circuit, by means of the photoresist technique in combination with etching techniques.

A plurality of test points 50 are formed at specific locations in the top layer of metalization 44, such as at specific coordinates in a rectilinear coordinate system and include generally rectangular or circular pads 52 having a conductor segment 54 extending therefrom to an individual standard pattern conductor 46 to displace the test pads 52 transversely from the associated master pattern interconnect (44). It should be understood that although the drawings intermix rectangular and circular pads 52, the test pads could all be of the same geometric shape and could have other geometric shapes including triangular, polygonal, semicircular, etc. With these test pads 52 displaced transversely from the interconnect lines 46 and their large area relative to the line widths, the probability of damage to the interconnect line by a test probe is significantly reduced. For example, these test pads 52 can be 0.003 inch wide and the line segment can be of any reasonable length. Of course the wider line segment themselves could be used as a test point.

With these test pads at specific locations in the top layer of metalization, numerous advantages can be attained by the above described circuit. For example, all desired used logic signal points are brought to the top layer of metalization whereupon the test points at standard locations can be used to monitor outputs from the individual circuits or to simulate inputs thereto for facilitating checkout without requiring additional package leads. In addition, the standard test pads defined in the top layer of metalization can be utilized to control — by presetting or preclearing — the flip-flop logic state in sequentially operated logic arrays, thereby usually enabling the test schedule to be reduced to a set of combinational tests. Still further, individual circuits in parallel redundant circuits can be tested for fault by forming test points associated with the signal connects of the individual circuits in the top layer of metalization. Furthermore, since any of the above mentioned tests and control points can be established at fixed positions in the top layer of metalization 44, automated probe testing of the array can be utilized to improve the economy, efficiency, speed and reliability of probe checkout methods. Additionally, the features obviate the requirements of additional package connections, processing steps, or mask generation costs.

While salient features have been illustrated and described with respect to a particular embodiment, it should be readily apparent that modifications can be made within the spirit and scope of the invention.

What is claimed is:

1. An integrated circuit interconnection method for interconnecting operable circuits into an electrical function on an integrated circuit wafer having a plurality of operable and inoperable circuits for testing the selected circuits in a uniform manner, the operable and inoperable circuits having random positions in a non-uniform distribution and having primary signal-connect means associated therewith at a first level of wafer metallization, comprising the steps of:

preparing a master pattern having predetermined circuit locations defining the positions of operable circuits to be selected from any of the operable circuits irrespective of their position and distribution the predetermined circuit locations corresponding to a standardized pattern of good circuits of all wafers to be similarly processed into the electrical function;

testing the plurality of operable and inoperable circuits at the primary signal-connect means to determine positions of operable and inoperable circuits;

selecting operable circuits from any of the tested operable circuits irrespective of their position and distribution on the wafer, the number of the selected operable circuits being at least equal to the number of predetermined circuit locations on the master pattern;

electrically coupling and routing the primary signal-connect means of each of the selected operable circuits to sites of secondary signal-connect means of each of the selected operable circuits by insulation and metallizing formation and masking processes and thereby terminating each of the selected operable circuits in the secondary signal-connect means and in the positions corresponding to the predetermined circuit locations of the master pattern;

selecting electrical coupling test-point means from at least a portion of some of the secondary signal-connect means, the test-point means positioned at test-point locations corresponding to a standardized pattern of test-point means conforming to the positions of probes on electrical testing apparatus;

electrically testing the selected operable circuits at the test-point means utilizing the electrical testing apparatus; and further electrically coupling the wafer circuits from the secondary signal-connect means into the electrical function by use of standard masking means identical to all wafers to be similarly processed into the electrical function.

2. The method of claim 1 wherein said coupling and testing steps further comprise the steps of:

electrically isolating each of the inoperable circuits, including each of the inoperable circuits coinciding with any ones of the predetermined circuit locations, and electrically isolating each of the unselected operable circuits by deposition of insulation material over the first level of metallization;

exposing the primary signal-connect means of the selected operable circuits by masking and insulation material removal means;

routing electrical conduction means from the exposed primary signal-connect means to the sites of the secondary signal-connect means, whereby some of the secondary signal-connect means at the predetermined circuit locations are situated at a corresponding number of the inoperable circuits in electrical isolation therefrom; and routing further electrical conduction means from the routed electrical conduction means to the test-point locations.

3. The method of claim 1 for use with a plurality of wafers, all to be interconnected into the electrical function, further including the steps of:

electrically coupling the primary signal-connect means of any ones of the selected operable circuits of each of the wafers to the sites of the secondary signal-connect means and electrically coupling in an identical manner for each of the wafers the secondary signal-connect means thereof by use of the identical masking means into identical circuit configurations corresponding to the electrical function; and electrically coupling the test-point means to the test-point locations corresponding to identical locations of the test-point means of the plurality of wafers.

4. An integrated circuit interconnection method for interconnecting operable circuits into an electrical function on each of a plurality of integrated circuit wafers and for identically testing the operable circuits, each of the wafers both capable of performing the same electrical function and having a plurality of operable and inoperable circuits in random positions of a non-uniform distribution, each of the operable and inoperable circuits having primary signal-connect means associated therewith in a first level of metallization, comprising the steps of:

preparing a master pattern having predetermined circuit locations, for each and every one of the wafers, the master pattern defining identical positions of operable circuits to be selected from any of the operable circuits irrespective of the position and distribution thereof on individual ones of the wafers at a level subsequent to the first level of metallization;

testing the plurality of operative and inoperative circuits of each of the wafers at the primary signal-connect means to determine locations of operable and inoperable circuits;

for each of the wafers, selecting operable circuits from any of the operable circuits irrespective of the position and distribution thereof on individual ones of the wafers, the number of selected operable circuits at least capable of performing the electrical function, and the number of the selected operable circuits being at least equal to the number of predetermined circuit locations of the master pattern;

for each of the wafers, electrically insulating the operable and inoperable circuits and the primary signal-connect means from one another to form a first insulation layer over the circuits and over the primary signal-connect means, with feedthrough means in the first insulation layer opening to the primary signal-connect means of the selected operable circuits;

for each of the wafers, electrically coupling and routing the primary signal-connect means of each of the selected operable circuits through the feedthrough means and to sites of secondary signal-connect means of each of the selected operable circuits and thereby terminating each of the selected operable circuits in the identical positions corresponding to the predetermined circuit locations of the master pattern;

electrically coupling identically positioned test-points for all the wafers to the secondary signal-connect means at test-point locations; and further identical electrically coupling and routing of each of the plurality of wafers from the secondary signal-connect means of each of the wafers by use of standard masking means identical to all of the wafers for interconnecting the selected operable circuits thereof in such a manner as to enable each of the wafers to perform the electrical function.

5. A method as in claim 4 further including the step of electrically testing the wafers at the test-point locations with a testing machine having a fixed array of probes corresponding in position to the test-point locations.

* * * * *